United States Patent
Nair et al.

(10) Patent No.: US 9,307,649 B2
(45) Date of Patent: Apr. 5, 2016

(54) MIXED-METAL SYSTEM CONDUCTORS FOR USE IN LOW-TEMPERATURE CO-FIRED CERAMIC CIRCUITS AND DEVICES

(71) Applicant: E I DU PONT DE NEMOURS AND COMPANY, Wilmington, DE (US)

(72) Inventors: Kumaran Manikantan Nair, Head of the Harbor, NY (US); Scott E Gordon, Cary, NC (US); Mark Frederick McCombs, Clayton, NC (US)

(73) Assignee: E I DU PONT DE NEMOURS AND COMPANY, Wilmington, DE (US)

(*) Notice: Subject to any disclaimer, the term of this patent is extended or adjusted under 35 U.S.C. 154(b) by 162 days.

(21) Appl. No.: 14/257,306

(22) Filed: Apr. 21, 2014

(65) Prior Publication Data

US 2014/0224530 A1 Aug. 14, 2014

Related U.S. Application Data

(63) Continuation of application No. 12/981,196, filed on Dec. 29, 2010, now Pat. No. 8,704,105.

(60) Provisional application No. 61/291,611, filed on Dec. 31, 2009.

(51) Int. Cl.
*H05K 3/00* (2006.01)
*H05K 1/09* (2006.01)
*H01B 1/22* (2006.01)
(Continued)

(52) U.S. Cl.
CPC ............... *H05K 3/0094* (2013.01); *H01B 1/22* (2013.01); *H05K 1/09* (2013.01); *H05K 1/092* (2013.01); *H05K 1/115* (2013.01); *H05K 1/095* (2013.01); *H05K 3/4061* (2013.01); *H05K 2201/032* (2013.01); *H05K 2201/09481* (2013.01); *H05K 2201/09563* (2013.01); *H05K 2203/1126* (2013.01)

(58) Field of Classification Search
CPC ........... H05K 1/09; H05K 3/0094; H01B 1/22
See application file for complete search history.

(56) References Cited

U.S. PATENT DOCUMENTS

| | | |
|---|---|---|
| 4,654,095 A | 3/1987 | Steinberg |
| 5,254,191 A | 10/1993 | Mikeska et al. |

(Continued)

OTHER PUBLICATIONS

PCT International Search Report mailed Mar. 11, 2011.

(Continued)

*Primary Examiner* — Jeremy C Norris

(57) ABSTRACT

A composition for forming transition vias and transition line conductors is disclosed for minimizing interface effects at electrical connections between dissimilar metal compositions. The composition has (a) inorganic components selected from the group consisting of (i) 20-45 wt % gold and 80-55 wt % silver and (ii) 100 wt % silver-gold solid solution alloys, and (b) an organic medium. The composition may also contain (c) 1-5 wt %, based upon the weight of the composition, of oxides or mixed oxides of metals selected from the group consisting of Cu, Co, Mg and Al and/or high viscosity glasses mainly containing refractory oxides. The composition may be used as a multi-layer composition in a via fill. Multi-layer circuits such as LTCC circuits and devices may also be formed using the composition for forming transition vias and transition line conductors.

5 Claims, 1 Drawing Sheet

(51) Int. Cl.
*H05K 1/11* (2006.01)
*H05K 3/40* (2006.01)

(56) References Cited

U.S. PATENT DOCUMENTS

| | | |
|---|---|---|
| 5,847,326 A | 12/1998 | Kawakami et al. |
| 7,550,319 B2 | 6/2009 | Wang et al. |
| 7,611,645 B2 | 11/2009 | Nair et al. |
| 2004/0070915 A1 | 4/2004 | Nagai et al. |
| 2007/0113952 A1 | 5/2007 | Nair et al. |
| 2008/0085594 A1 | 4/2008 | Li et al. |

OTHER PUBLICATIONS

Link, S., et al., Alloy Formation of Gold—Silver Nanoparticles and the Dependence of the Plasmon Absorption on Their Composition, Journal of Physical Chemistry B, May 6, 1999, pp. 3529-3533, vol. 103, No. 18.

MIXED-METAL SYSTEM CONDUCTORS FOR USE IN LOW-TEMPERATURE CO-FIRED CERAMIC CIRCUITS AND DEVICES

CROSS REFERENCE TO RELATED APPLICATIONS

This is a continuation application which claims priority under 35 U.S.C. 120 to U.S. application Ser. No. 12/981,196, filed Dec. 29, 2010 now U.S. Pat. No. 8,704,105. The patent application identified above is incorporated here by reference in its entirety to provide continuity of disclosure.

FIELD OF THE INVENTION

The invention relates to mixed-metal compositions useful for via-fill conductor compositions and line conductors which connect dissimilar conductive metal materials used in the manufacture of Low Temperature Co-fireable Ceramic (LTCC) multilayer ceramic circuits and devices, including multi-layer via fill structures using such mixed-metal compositions, as well as the LTCC circuits and devices themselves which employ such mixed-metal compositions and/or structures. The invention further relates to the use of the mixed-metal compositions, circuits and devices in microwave and other high frequency applications.

TECHNICAL BACKGROUND OF THE INVENTION

An interconnect circuit board of an LTCC design is a physical realization of electronic circuits or subsystems made from a number of extremely small circuit elements that are electrically and mechanically interconnected. It is frequently desirable to combine these diverse electronic components in an arrangement so that they can be physically isolated and mounted adjacent to one another in a single compact package and electrically connected to each other and/or to common connections extending from the package.

Complex electronic circuits generally require that the circuit be constructed of several layers of conductors separated by insulating dielectric layers. The conductive layers are interconnected between levels by electrically conductive pathways, called vias, through a dielectric layer. The conductors useful in LTCC technology are typically thick film conductors. LTCC multilayer structures allow a circuit to be more compact than traditional $Al_2O_3$ substrates by allowing vertical integration.

Similar to other thick film materials, thick film conductors are comprised of an active (conductive) metal and inorganic binders, both of which are in finely divided form and are dispersed in an organic vehicle. The conductive phase is ordinarily gold, palladium, silver, platinum or alloy thereof, the choice of which depends upon the particular performance characteristics which are sought, e.g., resistivity, solderability, solder leach resistance, bondability, adhesion, migration resistance and the like. In multilayer LTCC devices, additional performance characteristics are sought for internal conductor lines and via conductors which include minimization of conductor line "sinking" into the top and bottom dielectric layers on firing, minimal resistivity variation on repeated firing, optimal interface connectivity of line conductor to that of via-fill conductor, and optimal interface bonding of via-fill conductor to that of surrounding ceramic materials.

LTCC devices have been used in prior art high frequency applications, such as telecommunications, automotive or military applications including radar, for its multilayer, cofiring and flexible design capabilities. Many properties are required of the conductors used in the fabrication of multilayer circuits for high frequency including microwave applications, including desired resistivity, solderability, solder leach resistance, wire bondability, adhesion, migration resistance, and long term stability.

In addition to the proper level of conductivity and other properties listed above, there are many secondary properties which must also be present such as, wire bondability, good adhesion to both ceramic and thick films, solderability and compatibility to other thick films, both surface and buried, long-term stability without little or less properties degradation.

The use of precious metals such as gold conductors increases the cost of high-reliability LTCC devices and manufacturers, as would be expected, look for ways to reduce cost by reducing the use of such precious metals. One such method is to employ silver-based conductors rather than gold conductors. The reliability of silver-based conductors is relatively lower and wire-bonding is not possible. Gold conductors and Gold via fills may still be used in strategic placements to mitigate the effects of the lower cost, lower performance silver-based materials.

A conductive system for use in LTCC conductive elements which uses Pd/Ag or Pd/Pt/Ag mixtures is disclosed in commonly assigned U.S. Pat. No. 7,611,645 to Nair et al. A palladium-silver transition via fill conductor for a mixed metal system is disclosed in commonly assigned U.S. Pat. No. 7,550,319 to Wang et al.

However, such systems may be disposed to certain phenomena at the surface interface(s) between dissimilar metals. For example, the Kirkendall Effect, has been found in various alloy systems and is important in connection with bonding between different materials. In particular, it has been studied and is used to describe voids that are produced in the boundary region at a bonding interface especially during high temperature processes such as metallic powder sintering.

It is also considered that there may be EMF difference generated defects at the interface between different metals such as at an electrical connection in an LTCC device.

It would be desirable to employ a system which minimizes or eliminates such surface defects at bonds or connections between different metal materials in electrical devices such as LTCC devices

DETAILED DESCRIPTION OF THE FIGURES

SUMMARY OF THE INVENTION

Figure 1B:
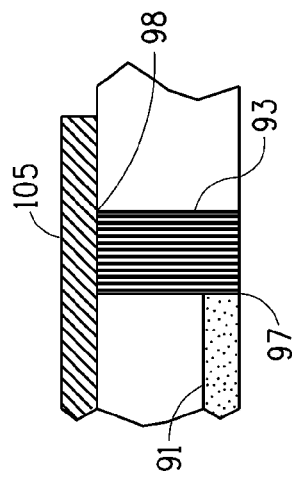
FIG. 1B is a detailed view of the transition via of FIG. 1A.

The invention provides a composition for forming transition vias and transition line conductors, said composition comprising:
 (a) inorganic components selected from the group consisting of (i) 20-45 wt % gold and 80-55 wt % silver and (ii) 100 wt % silver-gold solid solution alloys, and
 (b) an organic medium.

In embodiments of the invention, the composition for forming transition vias and transition line conductors further comprises (c) 1-5 wt %, based upon the weight of the composition, of oxides or mixed oxides of metals selected from the group consisting of Cu, Co, Mg and Al and/or high viscosity glasses mainly containing refractory oxides.

The invention provides a circuit comprising the transition line conductors described above having at least a first electrical connection and a second electrical connection, said first electrical connection being to a gold line conductor or a gold via and said second electrical connection to a silver line conductor or a silver via.

The invention also provides a circuit comprising the transition line vias described above having at least a first electrical connection and a second electrical connection, said first electrical connection being to a gold line conductor and said second electrical connection to a silver line conductor.

In another embodiment of the invention, a multi-layer transition via is provided comprising at least a first layer and a second layer in electrical contact with each other, wherein said first layer comprises (a) inorganic components selected from the group consisting of (i) 20-45 wt % gold and 80-55 wt % silver and (ii) 100 wt % silver-gold solid solution alloys, and (b) an organic medium, and the second layer comprises (a) inorganic components selected from the group consisting of (i) 20-45 wt % gold and 80-55 wt % silver and (ii) 100 wt % silver-gold solid solution alloys, and (b) an organic medium, and wherein said first layer and said second layer are different, and wherein the wt % of gold in the inorganic component of said first layer is greater than the wt % of gold in the inorganic component of said second layer.

This multi-layer transition via embodiment may have either or both of the first and second layers further comprising (c) 1-5 wt %, based upon the weight of the composition, of oxides or mixed oxides of metals selected from the group consisting of Cu, Co, Mg and A and/or high viscosity glasses mainly containing refractory oxides I.

The invention also provides a circuit comprising the multi-layer transition via described above having at least a first electrical connection and a second electrical connection, said first electrical connection being between the first layer and a gold conductor and said second electrical connection being between the second layer and a silver conductor.

The invention is further directed to methods of forming multilayer circuits utilizing the above composition and the use of the composition in high frequency applications (including microwave applications).

DETAILED DESCRIPTION OF THE INVENTION

The composition for forming transition vias and transition line conductors is made from (a) inorganic components selected from the group consisting of (i) 20-45 wt % gold and 80-55 wt % silver and (ii) 100 wt % silver-gold solid solution alloys, and (b) an organic medium and may further comprise (c) 1-5 wt %, based upon the weight of the composition, of oxides or mixed oxides of metals selected from the group consisting of Cu, Co, Mg and Al and/or high viscosity glasses mainly containing refractory oxides.

The composition for forming transition vias and transition line conductors of the invention may be used to form a circuit where the composition is in the form of a via or line conductors and connects a gold line conductor or a gold via and said second electrical connection to a silver line conductor or a silver via.

The invention also provides a circuit comprising the transition line vias described above having at least a first electrical connection and a second electrical connection, said first electrical connection being to a gold line conductor and said second electrical connection to a silver line conductor.

As discussed above, certain phenomena at the surface interface(s) between dissimilar metals like the Kirkendall Effect and EMF difference generated defects can cause problems with bonding between different materials and the resultant electrical connection.

Without intending to be bound by any particular theory or hypothesis, the inventors consider that the Kirkendall Effect and/or an EMF difference generated defect may cause defect formation during the thermal processing of an LTCC device or a portion of an LTCC device due to dissimilar metals in contact with each other. Accordingly, the function of a transition via and/or transition line conductor in accordance with the invention is to minimize the impact of that dissimilarity by using mixture of metals compatible to metals used in the bottom conductor line (in certain embodiments, the silver conductor line) and top conductor line (in that aforementioned certain embodiment, the gold conductor line). This will decrease the detrimental effects and create an improved LTCC device in terms of both performance and long term reliability.

In contrast, the conventional mixed metals systems described above such as Pd/Ag or Pd/Pt/Ag behave in an entirely different manner. As in the case described above, the top conductor line is gold and bottom conductor line is silver. In such conventional vias, particularly if Pd is present, during the firing process the Pd will oxidize and increase the volume by something on the order of 40%. Then as the temperature increases the PdO will reduce and form Pd. In the cooling cycle the same process will repeat in the opposite manner. Such a "redox" process will weaken the interface of conventional via and conventional conductor line.

In contrast, the Ag/Au mixture composition in accordance with the invention is not subject to the redox reaction described above. Also, the Ag/Au mixture composition in accordance with the invention is much more metallurgically compatible to both the bottom silver line and top gold line. It is believed that the Ag and Au will form a continuous solid solution.

Figure 1A:
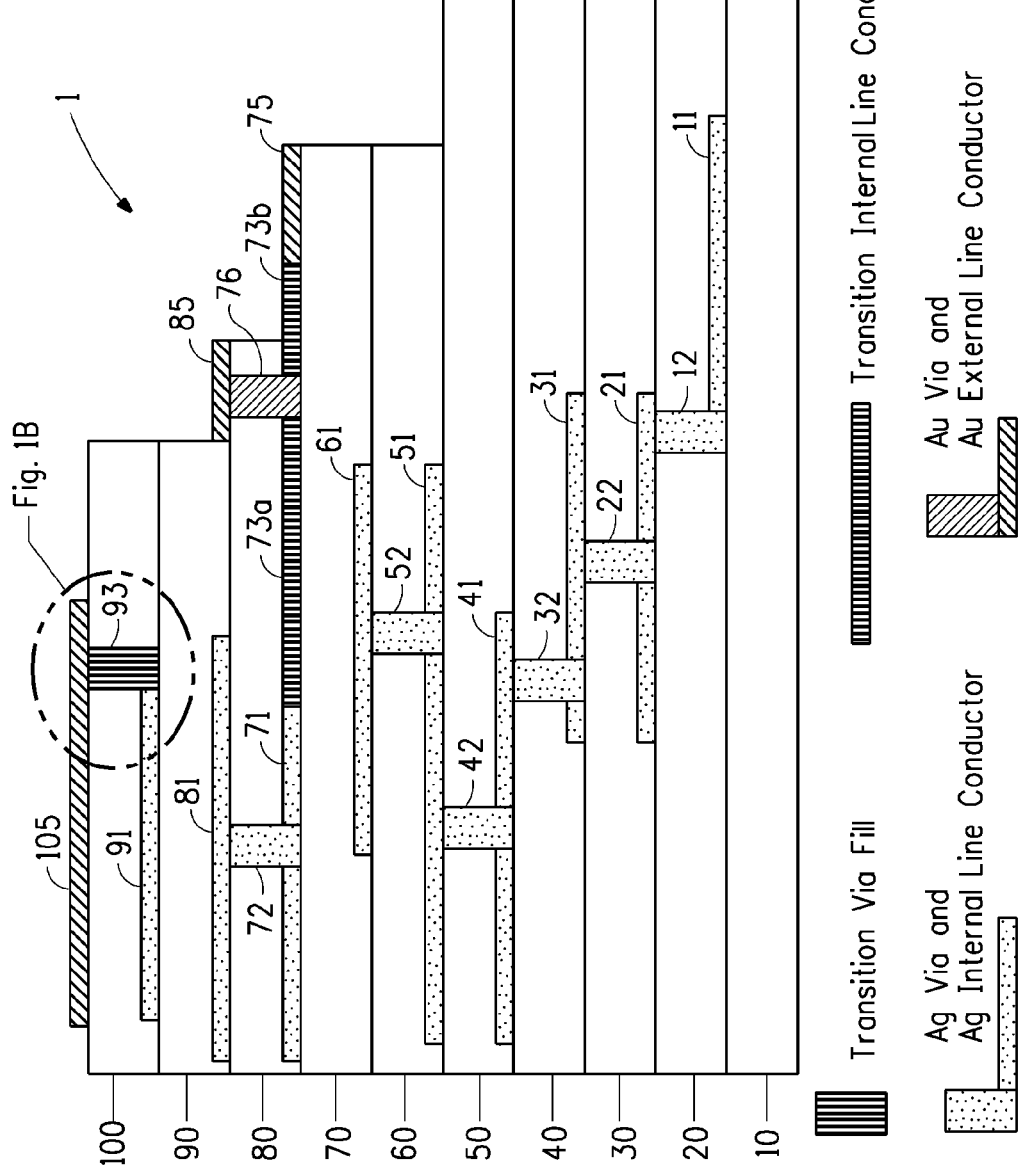
FIG. 1A shows a cross-sectional view of a Low Temperature Co-fireable Ceramic (LTCC) multilayer ceramic circuit employing embodiments of the invention.

FIG. 1A shows a cross-sectional view of a Low Temperature Co-fireable Ceramic (LTCC) multilayer ceramic circuit employing embodiments of the invention.

FIG. 1A shows a cross-sectional view of a Low Temperature Co-fireable Ceramic (LTCC) multilayer ceramic circuit 1 employing embodiments of the invention. Circuit 1 is formed from ten layers of dielectric material, the lowermost layer 10 having the next layer 20 deposited on top followed by layers 30, 40, 50, 60, 70, 80, 90 and uppermost layer 100, bottom to top. Silver internal line conductors 11, 21, 31, 41, 51, 61, 71, 81 and 91 are located on top of layers 10, 20, 30, 40, 50, 60, 70, 80 and 90, respectively. Silver via 12 electrically connects silver internal line conductors 11 and 21, silver via 22 electrically connects silver internal line conductors 21 and 31, silver via 32 electrically connects silver internal line conductors 31 and 41, silver via 42 electrically connects silver internal line conductors 41 and 51, silver via 52 electrically connects silver internal line conductors 51 and 61, and silver via 72 electrically connects silver internal line conductors 71 and 81. In this particular portion of circuit 1, there are no via connections running through layer 70 or layer 90.

Internal transition line conductor 73a in accordance with the invention electrically connects silver internal line conductor 71 with gold via 76. Transition line conductor 73b in accordance with the invention has both internal and external portions and electrically connects gold via 76 and gold external surface conductor 75. Gold external line conductor 85 is electrically connected to gold via 76.

External gold line conductor 105 is electrically connected to silver internal line conductor 91 by transition via 93 in accordance with an embodiment of the invention. Transition via 93, shown in FIG. 1 as a single layer embodiment, may also be a multi-layer embodiment in accordance with the invention as described in detail below. The exploded view of transition via 93 shows in greater detail the interfacial connections 97 and 98, connection 97 being between silver internal line conductor 91 and gold via 93 and connection 98 being between gold via 93 and external gold line conductor 105. In embodiments of the invention, the use of the compositions in accordance with the invention to form transition vias 93 and line conductors 73a and 73b prevents the formation of interfacial defects such as those which might develop in connection points similar to connections 97 and 98 wherein conventional mixed-metal systems are employed to electrically connect dissimilar metals.

The multi-layer transition via structure in accordance with the invention provides at least a first layer and a second layer in electrical contact with each other, wherein said first and second layers comprises (a) inorganic components selected from the group consisting of (i) 20-45 wt % gold and 80-55 wt % silver and (ii) 100 wt % silver-gold solid solution alloys, and (b) an organic medium.

The first layer and the second layer are different in composition, primarily because the wt % of gold in the inorganic component of the first layer is greater than the wt % of gold in the inorganic component of the second layer. This embodiment of the invention may be called a "two-step via" or the "two-step process."

Without intending to be bound by any particular theory or hypothesis, the inventors consider that if an equal number of atoms of Ag and Au were present in the transition via and also if the diffusion coefficients of Ag and Au were the same the Kirkendall defects would be negligible. However, the diffusion coefficients of Ag and Au are different and consequently are different so the diffusion of total ions can not be controlled.

The use of the multi-layer via embodiment in accordance with the invention is believed to have its positive effect by making the difference in diffusion coefficients negligible in the practical sense by making use of two or more different transition via compositions. The first composition is applied, for example by printing, to fill the via partially. Then the second composition is applied, for example by printing, to fill the via.

It is believed that the "two-step via" or the "two-step process" allows partial (or possibly nearly complete) distribution of Kirkendall defects within the via. Consequently, that minimizes the defects and separation of the via-top conductor line interface and/or the defects and separation of the via-bottom conductor line interface. It is believed that because the via contains many orders of magnitude more metal atoms when compared to the interface of via-top conductor line (or the interface of the via-bottom conductor line) as a consequence during thermal processing the metal ions present within the via will interdiffuse and defects will be minimum.

Figure 2:
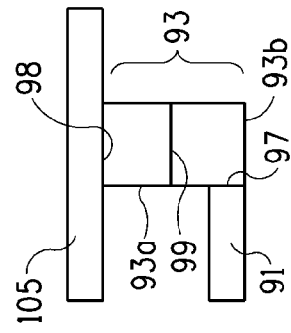
FIG. 2 shows a multi-layer via fill structure in accordance with the invention.

In FIG. 2, external gold line conductor 105 is electrically connected to silver internal line conductor 91 by transition via 93 in accordance with an embodiment of the invention. Transition via 93, shown in FIG. 1B as a single layer embodiment, is shown in FIG. 2 as a multi-layer embodiment comprising a first layer 93a and a second layer 93b. The gold content is higher in first layer 93a than in second layer 93b. This distributes the difference in metal content across three interfaces (97, 98 & 99) instead of two (97 & 98) as in FIG. 1A and in certain embodiments of the invention provides greater improvements interfacial defects in accordance with the invention In embodiments of the invention, the use of the compositions in accordance with the invention to form transition vias 93a and 93b prevents the formation of interfacial defects such as those which might develop in connection points similar to connections 97 and 98 wherein conventional mixed-metal systems are employed to electrically connect dissimilar metals. Instead, the interfacial defects are distributed across interfaces 97, 98 and 99 in accordance with the invention and are either diminished or eliminated by the use of the compositions in accordance with the invention to form first via layer 93a and a second via layer 93b.

In a further aspect, the invention is also considered to encompass screen-printable and/or stencil-applicable paste comprising the above-described composition for forming transition vias and transition line conductors which is dispersed in organic medium. Still further, the invention is considered to encompass conductive elements comprising a non-conductive LTCC ceramic substrate having a conductive pattern and connecting or non connecting via-fill conductive pattern affixed thereon, formed by printing a pattern of above-described screen-printable and/or stencil-applying paste and firing the printed and/or laminated LTCCs to effect volatization of the organic medium and liquid phase sintering of the inorganic materials and metallization. In yet another aspect, the invention is directed to a process for making conductors alone and/or in conjunction with via-fills comprising (a) applying patterned thick film of the above-described screen-printable paste to a non conductive ceramic substrate, (b) drying the film at a temperature, in embodiments of the invention a temperature below 200° C. and (c) firing the dried film to effect liquid phase sintering of the inorganic materials and metallization.

A. Conductive Material

The conductive materials or inorganic components in accordance with the invention are selected from the group consisting of (i) 20-45 wt % gold and 80-55 wt % silver and (ii) 100 wt % silver-gold solid solution alloys. These metals used in the invention can be selected from those which are commercially available. The particle size of the above-described metallic materials is not considered to have a significant impact from the standpoint of their technical effectiveness in the invention. However, they should, of course, be of a size appropriate to the manner in which they are applied, which is usually screen-printing and/or stencil-applying, and to the firing conditions. Furthermore, particle size and morphology of the above-mentioned metal powders should be appropriate in screen-printing and/or stencil-applying over non-fired ceramic tape of thickness between 2 mil to 10 mil and to the laminating conditions of the composite and to the firing conditions.

B. Organic Medium

The inorganic components are typically dispersed into an organic medium by mechanical mixing to form viscous compositions called "pastes" having suitable consistency and rheology for printing. A wide variety of inert liquids can be used as organic medium. The rheological properties of the medium must be such that they lend good application properties to the composition, including: stable dispersion of solids, appropriate viscosity and thixotropy for screen printing, acceptable unfired "green" strength, appropriate wettability of the substrate and the paste solids, a good drying rate, and good firing and burn out properties. The organic medium is typically a solution of polymer(s) in solvent(s). Additionally, a small amount of additives, such as surfactants, may be a part of the organic medium. The most frequently used polymer for this purpose is ethyl cellulose. Other examples of polymers include ethylhydroxyethyl cellulose, wood rosin, mixtures of ethyl cellulose and phenolic resins, polymethacrylates of lower alcohols, and monobutyl ether of ethylene glycol monoacetate can also be used. The most widely used solvents found in thick film compositions are ester alcohols and terpenes such as alpha- or beta-terpineol or mixtures thereof with other solvents such as kerosene, dibutylphthalate, butyl carbitol, butyl carbitol acetate, hexylene glycol and high boiling alcohols and alcohol esters. In addition, volatile liquids for promoting rapid hardening after application on the substrate can be included in the vehicle. Various combinations of these and other solvents are formulated to obtain the viscosity and volatility requirements desired.

The inorganic particles are mixed with an inert liquid medium (vehicle or medium) typically by mechanical mixing (e.g. on a roll mill) to form a paste-like composition having suitable consistency and rheology for screen printing and/or stencil applying. The latter is printed as a "thick film" on LTCC green tapes in the conventional manner. Any inert liquid may be used as the vehicle. Various organic liquids, with or without the thickening and/or stabilizing agents and/or other common additives may be used as the vehicle. The only specific criteria of the vehicle is that it must be chemically compatible to the organics present in the LTCC green tapes. Exemplary of organic liquids which can be used are the aliphatic alcohols, esters of such alcohols, for example, acetates and propionates, terpenes such as pine oil, terpinol and the like, texanol and the like, solutions of resins such as ethyl cellulose in solvents as pine oil, and the monobutyl ether of ethylene glycol monoacetate.

The vehicle may contain volatile liquids to promote fast setting after application to the tape.

The ratio of vehicle to solids in the dispersions can vary considerably and depends upon the manner in which the dispersion is to be applied and the kind of vehicle used and furthermore the use of the conductors are for the conductor lines and/or via-fill conductor connections. Normally to achieve good coverage the dispersions will comprise 60-98% solids and 40-2% organic medium (vehicle). The inner conductor compositions and surface conductor compositions may have reduced organic to inorganic ratios. Also, the organic components in the formulations in accordance with the invention may vary depending upon the inventive composition(s) either as a conductor line composition or a via fill composition. The compositions of the present invention may, of course, be modified by the addition of other materials, which do not affect its beneficial characteristics. In the instance of this invention, variations and formulations of the organic materials as described above are well within the skill of the art.

C. Oxides or Mixed Oxides of Metals

The embodiments of the invention including the via fill composition the line conductor composition and the multilayer transition via embodiment may further comprise (c) 1-5 wt %, based upon the weight of the composition, of oxides or mixed oxides of metals selected from the group consisting of Cu, Co, Mg and Al and/or high viscosity glasses mainly containing refractory oxides.

APPLICATIONS

The composition(s) of the present invention may be used in conjunction with uncured ceramic material, such as Green Tape™ Low Temperature Cofired Ceramic (LTCC), and various other paste components, to form a multilayer electronic circuit. Green Tape™ is typically used as a dielectric or insulating material for multilayer electronic circuits. A sheet of Green Tape™ is blanked with registration holes in each corner to a size somewhat larger than the actual dimensions of the circuit. To electrically connect various layers of the multilayer circuit, via holes are formed in the Green Tape™. This is typically done by mechanical punching, however, any suitable method may be utilized. For example, a sharply focused laser can be used to volatilize and form via holes in the Green Tape™.

Filling the vias with either a composition in accordance with the invention or another conventional thick film conductive composition (via-fill composition) forms the interconnections between layers. The via-fill compositions are usually applied by standard screen printing techniques, however, any suitable application technique may be employed. Each layer of circuitry is typically completed by screen printing conductor tracks. These tracks can utilize compositions of the present invention, or other suitable conductor compositions, or a combination thereof. Also, resistor inks or high dielectric constant inks can be printed on selected layer(s) to form resistive or capacitive circuit elements. Conductors, resistors, capacitors and any other components are typically formed by conventional screen printing techniques and are deemed as functional layers.

The composition(s) of the present invention may be printed on the outermost layers of the circuit (external or exposed), either before or after lamination. Additionally, the composition(s) of the present invention may be used on one or more of the inner layers of the circuit (internal), as well. Furthermore, embodiments of the composition(s) of the present invention may be used as a via-fill composition, as well. It is understood by those skilled in the art that the circuit may comprise "blank layers" or layers of dielectric or insulating material on which no functional conductive, resistive, or capacitive layers are deposited.

The outermost layers of the circuit are used to attach components. Components are typically wire-bonded, glued or soldered to the surface of fired parts.

After each layer of the circuit is completed, the individual layers are collated and laminated. A confined uniaxial or isostatic pressing die is typically used to ensure precise alignment between layers. The assemblies are trimmed to an appropriate size after lamination or after firing. Firing is typically carried out in a conveyor belt furnace or in a box furnace with a programmed heating cycle. The tape may be either constrained or free sintered during the firing process. For example, the methods disclosed in U.S. Pat. No. 4,654,095 to Steinberg and U.S. Pat. No. 5,254,191 to Mikeska may be utilized, as well as others known to those skilled in the art.

As used herein, the term "firing" means heating the assembly in an oxidizing atmosphere, such as air to a temperature, and for a time sufficient to volatilize (burn-out) the organic material in the layers of the assemblage and allow reaction and sintering of the inorganic components of both the tape and conductors. "Firing" causes the inorganic components in the layers, to react or sinter, and thus densify the entire assembly, thus forming a fired article. This fired article may be a multilayered circuit used in telecommunications, military or automotive applications (such as automotive position sensors, radar, transmit receive modules, antennas etc).

The term "functional layer" refers to the printed Green Tape™, which has conductive, resistive, capacitive or dielectric functionality. Thus, as indicated above, a typical Green Tape™ layer may have contain one or more conductive traces, conductive vias, resistors and/or capacitors.

As noted above, some embodiments of the composition(s), multilayer circuit(s) and device(s) of the present invention are particularly useful in microwave applications. "Microwave applications" are defined herein as applications which require a frequency in the range of 300 MHz to 300 GHz ($3\times10^8$ to $3\times10^{11}$ Hz). Furthermore, the present invention is useful in high frequency applications such as transmit/receive modules and radar applications. Still further, some of the embodiments of the present invention are useful in the formation of microwave circuit components including, but not limited to: antenna, filters, baluns, beam former, I/O's, couplers, feedthroughs (via or EM coupled), wirebond connection, and transmission lines.

Formulation of Thick Film Compositions (Pastes)

The thick film compositions of the present invention may be prepared according to the following general methodology. The inorganic solids are mixed with the organic medium and dispersed with suitable equipment, such as a three-roll mill, to form a suspension, resulting in a composition for which the viscosity will be in the range of 100-200 Pascal-seconds at a shear rate of 4 sec-1 for the line conductor compositions and the corresponding value for via-fill conductors is 1000-5000 Pascal-seconds.

Formulation may be carried out in the manner described in commonly assigned U.S. Pat. No. 7,611,645 to Nair et al., the procedure for which is incorporated herein by reference.

The invention claimed is:

1. A process to produce a composition for forming transition vias and transition line conductors comprising the steps of:
   a. providing a first layer comprising inorganic components selected from the group consisting of 20-45 wt % gold and 80-55 wt % silver dispersed in organic medium;
   b. providing a second layer comprising 100 wt % silver-gold solid solution alloys dispersed in organic medium;
   c. applying the first layer to partially fill a via;
   d. applying the second layer to the first layer to fill the via; and
   e. co-firing the first layer and the second layer in the via, wherein the first layer and the second layer are in electrical contact with each other, wherein the wt % of gold in the inorganic component of the first layer is greater than the wt % of gold in the inorganic component of the second layer, wherein the difference in diffusion coefficients of the first layer and the second layer is negligible.

2. The process of claim 1 further comprising providing 1-5 wt %, based upon the weight of the composition, of oxides or mixed oxides of metals selected from the group consisting of Cu, Co, Mg and Al and/or high viscosity glasses containing refractory oxides.

3. A composition produced by the process of claim 1 or 2.

4. A circuit comprising the composition of claim 3, the circuit having at least a first electrical connection and a second electrical connection, said first electrical connection being to a gold line conductor or a gold via and said second electrical connection to a silver line conductor or a silver via, wherein the transition line conductor contacts the first electrical connection at only one interface and the second electrical connection at only one interface, wherein interface of the first and second electrical connection are different, wherein the transition line conductor is not positioned perpendicular across a via.

5. A multi-layer transition via comprising the composition of claim 3.

* * * * *